United States Patent
Ha

(10) Patent No.: US 11,380,751 B2
(45) Date of Patent: Jul. 5, 2022

(54) ORGANIC LIGHTING APPARATUS INCLUDING FUSE STRUCTURE

(71) Applicant: LG Display Co., Ltd., Seoul (KR)

(72) Inventor: Hyunggun Ha, Busan (KR)

(73) Assignee: LG Display Co., Ltd., Seoul (KR)

( * ) Notice: Subject to any disclaimer, the term of this patent is extended or adjusted under 35 U.S.C. 154(b) by 7 days.

(21) Appl. No.: 16/503,159

(22) Filed: Jul. 3, 2019

(65) Prior Publication Data
US 2020/0212157 A1 Jul. 2, 2020

(30) Foreign Application Priority Data

Dec. 31, 2018 (KR) .......... 10-2018-0173490

(51) Int. Cl.
*H01L 27/32* (2006.01)

(52) U.S. Cl.
CPC ...... *H01L 27/3276* (2013.01); *H01L 27/3202* (2013.01); *H01L 2251/5392* (2013.01)

(58) Field of Classification Search
CPC ............. H01L 27/3276; H01L 27/3202; H01L 2251/5392
USPC .......................................................... 257/40
See application file for complete search history.

(56) References Cited

U.S. PATENT DOCUMENTS

| | | | | |
|---|---|---|---|---|
| 4,041,435 | A * | 8/1977 | Gaia | H01H 85/10 337/159 |
| 6,476,563 | B2 | 11/2002 | Silvestre | |
| 8,174,005 | B2 | 5/2012 | Kim | |
| 2002/0036471 | A1 | 3/2002 | Silvestre | |
| 2007/0210414 | A1 * | 9/2007 | Iwamoto | H01L 23/5329 257/529 |
| 2011/0101314 | A1 | 5/2011 | Kim | |
| 2012/0038847 | A1 | 2/2012 | Lin et al. | |
| 2015/0325809 | A1 | 11/2015 | Yoshida et al. | |
| 2017/0069703 | A1 * | 3/2017 | Yen | H01L 27/3276 |
| 2017/0092891 | A1 * | 3/2017 | Tanaka | H01L 51/5228 |
| 2017/0346035 | A1 * | 11/2017 | Lee | H01L 51/5234 |

FOREIGN PATENT DOCUMENTS

| | | |
|---|---|---|
| EP | 3144993 A1 | 3/2017 |
| EP | 3236507 A1 | 10/2017 |
| KR | 10-2001-0109322 A | 12/2001 |
| KR | 10-2011-0049261 A | 5/2011 |

OTHER PUBLICATIONS

European Patent Office, Extended European Search Report and Opinion, EP Patent Application No. 19216449.9, dated May 27, 2020, eight pages.

* cited by examiner

*Primary Examiner* — Thao X Le
*Assistant Examiner* — Gardner W. S. Swan
(74) *Attorney, Agent, or Firm* — Fenwick & West LLP

(57) ABSTRACT

Disclosed herein is an organic lighting apparatus that can reduce leakage current. The organic lighting apparatus includes a plurality of light-emitting portions, each of which has a first electrode including an electric current injection line, wherein the electric current injection line includes one or more fuse structures. With the electric current injection line including a fuse structure, when a short circuit occurs between first and second electrodes in a specific light-emitting portion, the fuse operates and prevents electric current from being injected into the short-circuited light-emitting portion, thereby making it possible to reduce leakage current.

17 Claims, 6 Drawing Sheets

(a)

(b)

ORGANIC LIGHTING APPARATUS
INCLUDING FUSE STRUCTURE

CROSS-REFERENCE TO RELATED APPLICATION

This application claims priority to and the benefit of Republic of Korea Patent Application No. 10-2018-0173490, filed on Dec. 31, 2018, which is incorporated herein by reference in its entirety.

FIELD

The present disclosure relates to an organic lighting apparatus and, more specifically, to an organic lighting apparatus that can reduce leakage current.

BACKGROUND

Currently, fluorescent lamps or incandescent lamps are used as a lighting apparatus. However, fluorescent lamps have a low color rendering index (CRI) and contain mercury that is one of the causes of environmental pollution while incandescent lamps have low energy efficiency.

Recently, LED lights using a nitride semiconductor-based light-emitting diode have been presented. However, LED lights require a means to dissipate a large amount of heat generated from light-emitting diodes at the rear surfaces thereof.

Light-emitting diodes are manufactured through the processing of epitaxial vapor deposition on a rigid substrate such as a sapphire substrate. Accordingly, light-emitting diodes are hardly flexible unless an individual light-emitting diode chip is mounted onto a flexible substrate.

Research in an organic lighting apparatus using organic light-emitting diodes has been underway to overcome the limitations of conventional nitride semiconductor-based LED lights. Large-scale fabrication of an organic light-emitting diode can be easily achieved, and organic light-emitting diodes can be formed on an inexpensive glass substrate or an inexpensive plastic substrate. When organic light-emitting diodes are formed on a plastic substrate, a flexible organic lighting apparatus can be manufactured.

An organic lighting apparatus includes a plurality of light-emitting portions. When a short circuit occurs between an anode and a cathode in any one of the light-emitting portions, no light-emitting portions may operate.

SUMMARY

The present disclosure provides an organic lighting apparatus that can reduce leakage current even when a short circuit occurs between an anode and a cathode in any one of the light-emitting portions.

The present disclosure provides an organic lighting apparatus that has a structure for reducing a short circuit.

The objectives of the present disclosure should not be limited to what has been mentioned. Additionally, the other objectives and advantages that have not been mentioned may be understood from the following description and implementations. Further, it will be apparent that the objectives and advantages of the present disclosure may be implemented through means and a combination thereof in the appended claims.

According to the subject matter described in this specification, an organic lighting apparatus includes a substrate and a plurality of light-emitting portions arranged on the substrate. Each of the plurality of light-emitting portions includes a first electrode, an organic light-emitting layer on the first electrode, and a second electrode on the organic light-emitting layer. Additionally, the plurality of light-emitting portions respectively includes a light-emitting area and a non-light-emitting area outside the light-emitting area. A first electrode of each of the plurality of light-emitting portions includes an electric current injection line in the non-light-emitting area. The electric current injection line has resistance higher than the resistance of a remaining part of the first electrode. The electric current injection line may have a fuse structure.

According to the present disclosure, a fuse structure may be included in the electric current injection line of the light-emitting portion. Accordingly, when a short circuit occurs between a first electrode and a second electrode in a specific light-emitting portion among the plurality of the light-emitting portions, the first electrode becomes open by means of the fuse. Thus, electric current is not injected into the short-circuited light-emitting portion. That is, a short circuit in a specific light-emitting portion rarely affects the operation of the other light-emitting portions. As a result, the organic lighting apparatus can prevent a lower luminance caused by leakage current.

A first insulator line is arranged on one side of the electric current injection line while a second insulator line is arranged on the other side of the electric current injection line. Each of the first and second insulator lines includes a convex and concave pattern including a protrusion portion and a recess portion, and the fuse structure is formed on the current injection line where the protrusion portion of the first insulator line and the protrusion portion of the second insulator line face each other. In the present disclosure, a fuse may be formed through a structure of the first and second insulator lines that define the electric current injection line without an additional fuse element.

A gap between the protrusion portion of the first insulator line and the protrusion portion of the second insulator line is preferably 1.5 µm or less. When a gap between the protrusion portion of the first insulator line and the protrusion portion of the second insulator line is 1.5 µm or less, a first electrode between the protrusion portion of the first insulator line and the protrusion portion of the second insulator line is stably open by means of generated heat, thereby making it possible to improve credibility of the fuse.

An integrally structured gate line may be arranged in the non-light-emitting area, contacting the first electrode. In this case, the non-light-emitting area may have a structure where a gate line, a first electrode and an insulation layer are stacked.

A pad portion may be arranged on one edge of the substrate. As another example, a first pad portion is arranged on one edge of the substrate, and a second pad portion may be arranged on the other edge of the substrate.

In another embodiment, an organic lighting apparatus includes a substrate, a gate line, a first insulator line, a second insulator line, a first electrode, an insulation layer and an organic light-emitting layer. The gate line is arranged on the substrate and defines a plurality of light-emitting portions. The first insulator line is arranged along the gate line on the edges of the plurality of light-emitting portions. The second insulator line is along a part of the first insulator line.

The first electrode is arranged on the substrate in areas excluding the first insulator line and the second insulator line. In processing, a first electrode is arranged on the front surface of the substrate in which the gate line is arranged, and then first and second insulator lines may be formed through etching. An insulation layer is disposed over the gate line. The first insulator line and the second insulator line may be a part of the insulation layer. An organic light-emitting layer is disposed on the insulation layer and the first electrode. The second electrode is arranged on the organic light-emitting layer. Each of the first and second insulator lines includes a convex and concave pattern including a protrusion portion and a recess portion, and the protrusion portion of the first insulator line and the protrusion portion of the second insulator line face each other. A fuse is formed in a part where the protrusion portion of the first insulator line and the protrusion portion of the second insulator line face each other.

A gap between the protrusion portion of the first insulator line and the protrusion portion of the second insulator line is preferably 1.5 μm or less.

The first electrode includes an electric current injection line between the first insulator line and the second insulator line. The electric current injection line may be a part of the first electrode. The electric current injection line has resistance higher than the resistance of a remaining part of the first electrode. For instance, when an electric current injection line is arranged between the first insulator line and the second insulator line, a resistance value of the electric current injection line may be determined according to a length of the electric current injection line.

The gate line may comprise a metallic material, and the first electrode may comprise transparent conductive oxide. In the case of a first electrode made of a transparent conductive oxide, light emits from the lower part of the substrate. The second electrode is usually made of a metallic material such as aluminum and, in this case, may serve as a reflecting electrode. In the case of a second electrode made of a transparent conductive oxide, light may emit from the upper and lower parts of the substrate.

A pad portion may be arranged on the outer area of the substrate. A first pad and a second pad of the pad portion may respectively include a first layer formed as the same layer as the gate line and a second layer formed as the same layer as the first electrode.

According to the present disclosure, an organic lighting apparatus includes electric current injection lines that are arranged in a plurality of light-emitting portions, and the electric current injection lines include a fuse structure. Even when a short circuit occurs between the first electrode and the second electrode in any one of the plurality of light-emitting portions, the fuse may prevent electric current from being injected into the short-circuited light-emitting portion. Thus, at the time of short circuit, leakage current can be reduced, thereby making it possible to prevent a lower luminance of the other light-emitting portions.

According to the organic lighting apparatus, a fuse is formed through a structure of the electric current injection lines of the plurality of the light-emitting portions. Accordingly, a fuse may be simply included in the organic lighting apparatus without an additional fuse element.

In still another embodiment, an organic lighting apparatus comprises a substrate; a plurality of gate lines arranged on the substrate in a first net shape; an insulation layer covering the gate lines and arranged in a second net shape; and a plurality of light-emitting portions, at least one of the light-emitting portions comprising: a first electrode; an organic light-emitting layer on the first electrode; and a second electrode on the organic light-emitting layer, wherein the first electrode includes an electric current injection line having resistance higher than the resistance of a remaining part of the first electrode, and the electric current injection line includes a fuse structure.

In some embodiments, the electric current injection line comprises a convex and concave pattern that includes a protrusion portion and a recess portion on both a first side and a second side of the current injection line. In some embodiments, a first electric current injection line of a first light-emitting portion among the plurality of light-emitting portions has a first length and a second electric current injection line of a second light emitting portion among the plurality of light-emitting portions has a second length shorter than the first length, the second light emitting portion being farther from an edge of the organic lighting apparatus than the first light emitting portion.

In some embodiments, the electric current injection line extends along a first direction, and a width of the electric current injection line along a second direction intersecting the first direction is 1.5 μm or less. In some embodiments, a part of the first electrode is between the insulation layer and at least one of the gate lines. In some embodiments, a part of the first electrode is disposed under at least one of the gate lines, and the insulation layer is disposed on the at least one of the gate lines. In some embodiments, the organic lighting apparatus further comprises a first pad electrically connected to the first electrode and a second pad electrically connected to the second electrode, both the first pad and the second pad formed as same layers as the first electrode and the gate lines. In some embodiments, the gate lines comprise metallic material, and the first electrode comprises transparent conductive oxide.

In still another embodiment, an organic lighting apparatus comprises a substrate; a plurality of gate lines arranged on the substrate in a first net shape; an insulation layer covering the gate lines and arranged in a second net shape; and a plurality of light-emitting portions, at least one of the light-emitting portions comprising: a first electrode; an organic light-emitting layer on the first electrode; a second electrode on the organic light-emitting layer; a first insulator line that is arranged along at least one of the gate lines on a first side of a portion of the first electrode; and a second insulator line that is arranged along a part of the first insulator line on a second side of the portion of the first electrode, wherein each of the first insulator line and the second insulator line comprises a convex and concave pattern that includes a protrusion portion and a recess portion, and the protrusion portion of the first insulator line and the protrusion portion of the second insulator line face each other.

In some embodiments, the second insulator line of a first light-emitting portion among the plurality of light-emitting portions has a first length and the second insulator line of a second light emitting portion among the plurality of light-emitting portions has a second length shorter than the first length, the second light emitting portion being farther from an edge of the organic lighting apparatus than the first light emitting portion. In some embodiments, a gap between the protrusion portion of the first insulator line and the protrusion portion of the second insulator line is 1.5 μm or less. In some embodiments, a part of the first electrode is between the insulation layer and at least one of the gate lines. In some embodiments, a part of the first electrode is disposed under at least one of the gate lines, and the insulation layer is disposed on the at least one of the gate lines. In some embodiments, the organic lighting apparatus further comprises a first pad electrically connected to the first electrode and a second pad electrically connected to the second electrode, both the first pad and the second pad formed as same layers as the first electrode and the gate lines. In some embodiments, the gate lines comprise metallic material, and the first electrode comprises transparent conductive oxide.

In still another embodiments, an organic lighting apparatus comprises: a substrate; a plurality of gate lines arranged on the substrate in a first net shape; an insulation layer covering the gate lines and arranged in a second net shape; and a plurality of light-emitting portions, at least one of the light-emitting portions comprising: a first electrode; an organic light-emitting layer on the first electrode; and a second electrode on the organic light-emitting layer; wherein the first electrode includes an elongated portion having resistance higher than the resistance of a remaining part of the first electrode outside the elongated portion.

In some embodiments, the organic lighting apparatus further comprises a first insulator line disposed along a first side of the elongated portion and a second insulator line disposed along a second side of the elongated portion. In some embodiments, the first insulator line is longer than the second insulator line. In some embodiments, a distance between the first insulator line and the second insulator line corresponds to a width of the elongated portion in a first direction intersecting a second direction in which the elongated portion is extended. In some embodiments, the width of the elongated portion is 1.5 μm or less.

In some embodiments, the elongated portion of the first electrode includes a pattern of a plurality of protrusions and recesses in a first direction intersecting a second direction in which the elongated portion is extended. In some embodiments, resistance of the elongated portion is higher between the recesses than between the protrusions of the elongated portion. In some embodiments, a fuse structure is formed between the recesses of the elongated portion. In some embodiments, a part of the first electrode is between the insulation layer and at least one of the gate lines. In some embodiments, a part of the first electrode is disposed under at least one of the gate lines, and the insulation layer is disposed on the at least one of the gate lines.

In some embodiments, the organic lighting apparatus further comprises a first pad electrically connected to the first electrode and a second pad electrically connected to the second electrode, both the first pad and the second pad formed as same layers as the first electrode and the gate lines. In some embodiments, the gate lines comprise metallic material, and the first electrode comprises transparent conductive oxide.

Effects and advantages of the present disclosure will be specifically described in the detailed description of the present disclosure.

DETAILED DESCRIPTION

Figure 1:
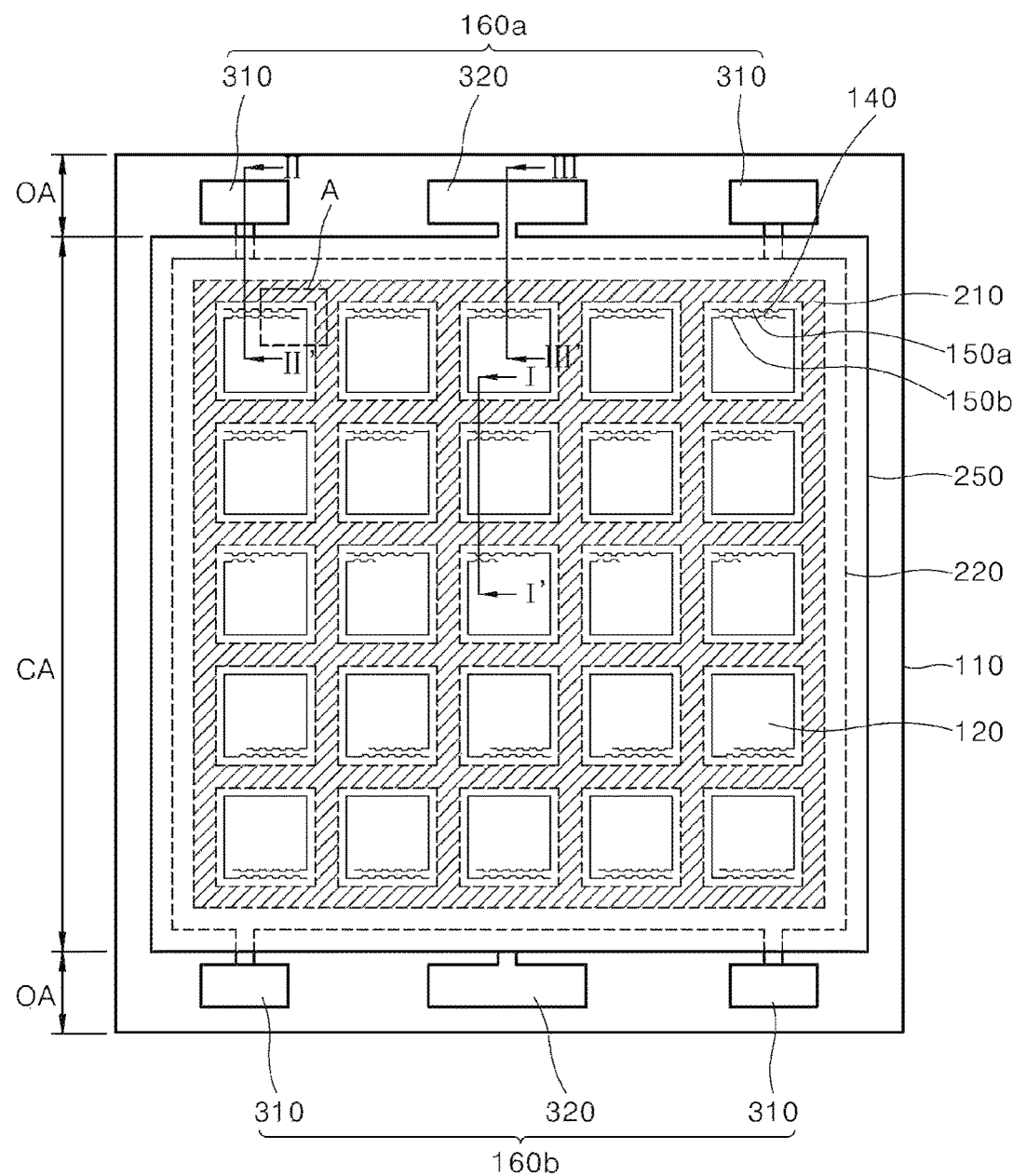
FIG. 1 is a plan view schematically illustrating an example organic lighting apparatus.

The above-mentioned objectives, features and advantages will be described with reference to the attached drawings such that one having ordinary skill in the art readily implements the present disclosure. In describing the disclosure, detailed description of the well-known technologies in relation to the disclosure will be omitted if it is deemed to make the gist of the disclosure unnecessarily vague. Implementations of the disclosure will be described with reference to the attached drawings. Like reference numerals denote like elements throughout the specification.

It should be understood that when one element is described as being arranged in the "upper part (or lower part)" of another element, or at the "top (or bottom)" of another element, one element may be directly arranged on the upper surface (or lower surface) of another element while contacting another element, and a third element may be interposed between one element arranged at the top (or bottom) of another element and another element.

It should be further understood that when one element is described as being "linked", "coupled", or "connected" to another element, one element may be directly linked or connected to another element, a third element may be "interposed" between one element and another element, or one element and another element may be "linked", "coupled" or "connected" by a third element.

An example organic lighting apparatus according to embodiments herein will be described.

Figure 2:
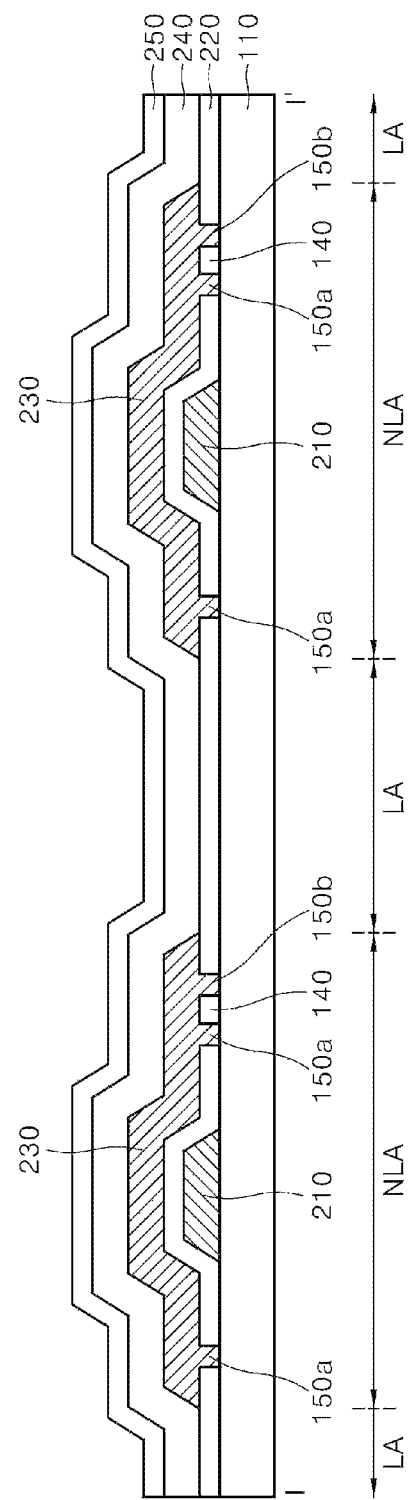
FIG. 2 is a view illustrating a cross section cut along line I-I' in FIG. 1.

FIG. 1 is a plan view schematically illustrating an example organic lighting apparatus, and FIG. 2 is a view illustrating a cross section cut along line I-I' in FIG. 1.

Referring to FIGS. 1 and 2, the illustrated example organic lighting apparatus includes a substrate 110 and a plurality of light-emitting portions 120 arranged on the substrate. However, the number of the light-emitting portions 120 is not restricted.

The substrate 110 may be made of glass or plastic such as polyimide (PI), polyethylene terephthalate (PET), polypropylene (PP), polycarbonate (PC), and the like. In the case of a substrate 110 made of plastic, an organic light-emitting apparatus may be flexible. When the substrate 110 is made of plastic, organic light-emitting apparatuses may be continuously manufactured by means of roll-to-roll processing. An internal light extraction layer as in a structure of a microlens may be further arranged on the substrate 110 to improve luminous efficiency. A light extraction film may be further attached to the lower part of the substrate 110 to improve luminous efficiency. A barrier layer may be further arranged on the upper part of the substrate 110 to prevent moisture from invading from the lower part of the substrate. A single layer of $SiO_2$, $SiN_x$, and the like may be arranged as a barrier layer, or multiple layers of $SiN_x/SiO_2/SiN_x$, or the like may be arranged as a barrier layer.

The plurality of light-emitting portions 120 have a structure in which a first electrode 220, an organic light-emitting layer 240 and a second electrode 250 are stacked Additionally, the plurality of light-emitting portions 120 include a light-emitting area (LA) and a non-light-emitting area (NLA) outside the light-emitting area. Referring to FIG. 2, when electric current is supplied, light emits in the light-emitting area (LA) with a structure in which a first electrode 220, an organic light-emitting layer 240 and a second electrode 250 are stacked. On the other hand, even when electric current is supplied, light does not emit in the non-light-emitting area (NLA) with a structure in which a first electrode 220, an insulation layer 230, an organic light-emitting layer 240 and a second electrode 250 are stacked.

The first electrode 220 may be made of a transparent conductive oxide such as indium tin oxide (ITO), fluorine-doped tin oxide (FTO), and the like. The insulation layer 230 may be made of an organic material such as a polyimide-based material or an inorganic material such as alumina (Al2O3) or silicon nitride (SiNx), and the like.

The organic light-emitting layer 240 includes organic light-emitting materials such as copper phthalocyanine (CuPc), N,N'-Di(naphthalene-1-yl)-N,N'-diphenylbenzidine (NPB), tris-8-hydroxyquinoline aluminum (Alq3) or various well-known organic light-emitting materials. The organic light-emitting layer 240 may include an electron injection layer, an electron transport layer, a light-emitting layer, a hole transport layer, a hole injection layer, and the like.

In this case, a tandem-structured light-emitting layer that includes two or more light-emitting layers may be used as an organic light-emitting layer. A structure in which two or more light-emitting layers are directly stacked or a structure in which an intermediate layer such as a hole transport layer or an electron transport layer, and the like is included between two or more light-emitting layers may be used for an organic light-emitting layer. For instance, tandem structures of an organic light-emitting layer includes a structure where a blue light-emitting layer, a green light-emitting layer and a red light-emitting layer are consecutively stacked, a structure where a red light-emitting layer and a red light-emitting layer are consecutively stacked, a structure where a blue light-emitting layer, a yellow/green light-emitting layer and a blue light-emitting layer are consecutively stacked, a structure where a red/green light-emitting layer, a blue light-emitting layer and a red/green light-emitting layer are consecutively stacked, or the like.

Aluminum (Al), silver (Ag), and the like or a transparent conductive oxide such as ITO, and the like may be used for the second electrode 250.

Suppose the first electrode 220 is an anode while the second electrode 250 is a cathode. Electrons are injected into the organic light-emitting layer 240 from the second electrode 250, and holes are injected into the organic light-emitting layer 240 from the first electrode 220. As the electrons and the holes are injected into the organic light-emitting layer 240, excitons are generated in the organic light-emitting layer 240, and as the excitons decay, light corresponding to a difference in energy of the lowest unoccupied molecular orbital (LUMO) and the highest occupied molecular orbital (HOMO) of the organic light-emitting layer 240 is generated.

Figure 3:
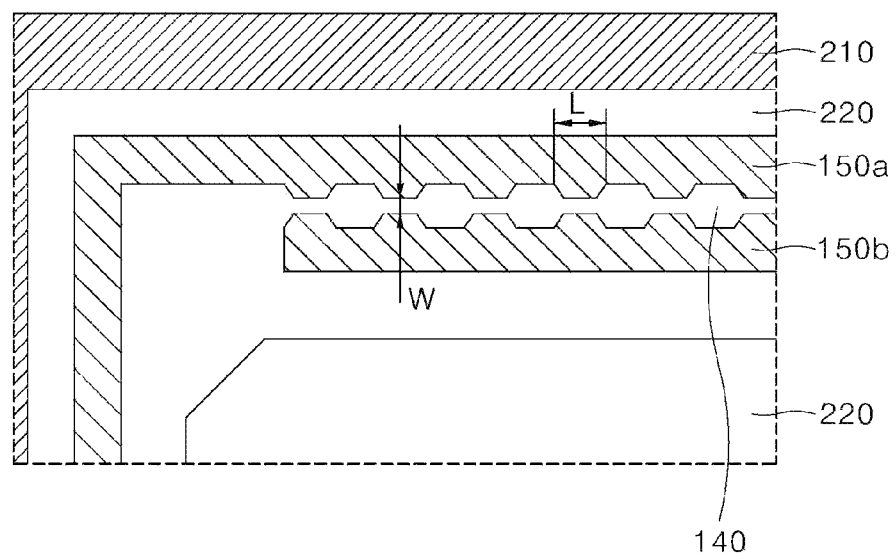
FIG. 3 is an enlarged view illustrating part A in FIG. 1.

FIG. 3 is an enlarged view illustrating part A in FIG. 1 and an example electric current injection line 140 with an example fuse structure.

Referring to FIGS. 1 to 3, the first electrode 220 of each of the plurality of light-emitting portions 120 has an electric current injection line 140 in the non-light-emitting area (NLA). The electric current injection lines 140 are parts with high resistance in the light-emitting portion 120. The electric current injection line 140 raises a barrier to entry of electric current into the light-emitting area (LA) of the light-emitting portion 120 by means of high resistance. In the presence of the electric current injection lines, a short circuit of the first and second electrodes that occurs in one light-emitting portion hardly affects the other light-emitting portions. If a light-emitting portion does not have electric current injection lines, no light-emitting portions may operate when a short circuit of the first and second electrodes occurs in one light-emitting portion. In this regard, the electric current injection lines may be referred to as a short circuit reducer.

In one embodiment, the electric current injection line 140 includes a fuse structure. Accordingly, even when a short circuit of the first and second electrodes in one light-emitting portion occurs, the fuse prevents electric current from being injected into the short-circuited light-emitting portion, thereby making it possible to reduce leakage current.

The fuse is formed in a part where a width of the electric current injection line is narrow. In the case of an electric current injection line 140 made of ITO, when a short circuit occurs in a specific light-emitting portion, heat of 1000° C. or more is locally generated, and the electric current injection line loses the property of electrical conductivity. In electrical aspects, this indicates one of the electric current injection lines is open. In this case, electric current is not injected into the short-circuited light-emitting portion. Thus, even when a short circuit occurs in a specific light-emitting portion, electric current is not injected into the short-circuited light-emitting portion, thereby making it possible to reduce leakage current and prevent a lower luminance of the other light-emitting portions.

Figure 4:
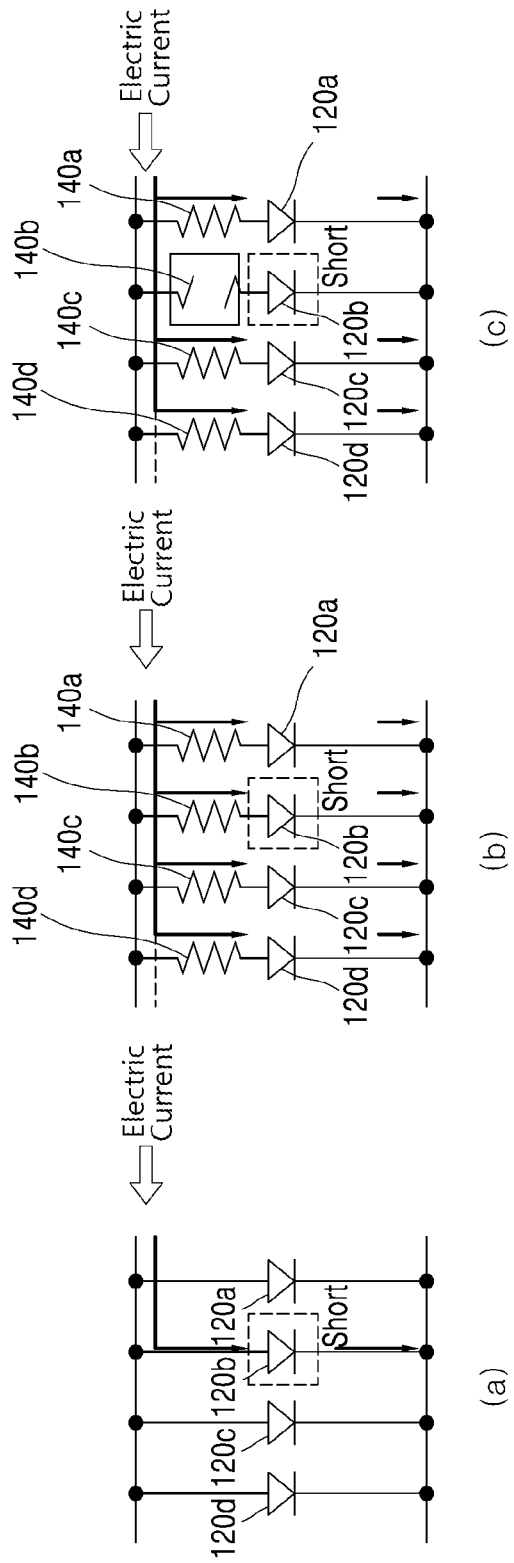
FIG. 4 illustrates electric current when a short circuit occurs, where part (a) is a view illustrating electric current when a short circuit occurs in the absence of an example electric current injection line, part (b) is a view illustrating electric current when a short circuit occurs in the presence of an example electric current injection line, and part (c) is a view illustrating electric current when a short circuit occurs in the presence of an example electric current injection line with a fuse structure.

FIG. 4, part (a) is a view illustrating electric current when a short circuit occurs in the absence of an example electric current injection line, FIG. 4, part (b) is a view illustrating electric current when a short circuit occurs in the presence of an example electric current injection line, and (c) is a view illustrating electric current when a short circuit occurs in the presence of an example electric current injection line having a fuse.

Referring to part (a) of FIG. 4, in the case of a light-emitting portion without electric current injection lines, when a short circuit of first and second electrodes occurs in a specific light-emitting portion 120b, electric current may be injected only into the short-circuited specific light-emitting portion 120b but not be injected into the other light-emitting portions 120a, 120c, 120d. Thus, no organic light-emitting apparatuses are likely to operate.

On the contrary, referring to (b) of FIG. 4, in the case of a light-emitting portion with electric current injection lines 140a, 140b, 140c, 140d having high resistance, even when a short circuit of first and second electrodes occurs in a specific light-emitting portion 120b occurs, electric current may be normally injected into the other light-emitting portions 120a, 120c, 120d in the presence of the electric current injection line 140b. Thus, only the short-circuited light-emitting portion 120b fails to operate. When electric current is supplied to the short-circuited light-emitting portion 120b, it is referred to as leakage current.

Referring to part (c) of FIG. 4, in the case of a light-emitting portion with electric current injection lines 140a, 140b, 140c, 140d having a fuse structure and high resistance, even when a short circuit of first and second electrodes occurs in a specific light-emitting portion 120b occurs, electric current may be normally injected into the other light-emitting portions 120a, 120c, 120d in the presence of the electric current injection line 140b. Thus, the short-circuited light-emitting portion 120b only does not operate. Further, the electric current injection line 140b of the short-circuited light-emitting portion 120b is open such that electric current is prevented from being injected into the short-circuited light-emitting portion 120b. According to part (c) of FIG. 4, leakage current may be reduced at the time of short circuit.

Loss of electric current caused by a short circuit of the first and second electrodes in a specific light-emitting portion may be expressed as follows:

Loss of electric current=driving voltage/resistance of electric current injection line.

That is, loss of electric current is inversely proportional to resistance of electric current injection line. As in the present disclosure, resistance of electric current injection line leads to a reduction in the loss of electric current. When an electric current injection line is open, the electric current injection line has infinite resistance, and loss of electric current is close to zero.

In the case of an electric current injection line made of ITO, resistance of the electric current injection line may be expressed as follows:

Resistance of electric current injection line=ITO sheet resistance×length of electric current injection line/width of electric current injection line.

According to the above formula, ITO sheet resistance is determined according to material. Thus, resistance of an electric current injection line may be adjusted on the basis of a width and a length of the electric current injection line. When an electric current injection line is lengthened or narrowed, resistance of the electric current injection line increases.

Referring to FIGS. 1 and 3, a first insulator line 150a and a second insulator line 150b are arranged on both sides of an electric current injection line 140. The first insulator line 150a and the second insulator line 150b comprise insulating material with much higher resistance than the electric current injection line 140 that is part of the first electrode 220. In processing, a first electrode 220 is arranged on the front surface of a substrate, and then lines are formed through etching and filled with insulators so as to form first and second insulator lines 150a, 150b.

The first insulator line 150a arranged along the edge of a light-emitting portion is to prevent electric current from being injected into other parts of the first electrode except for an electric current injection line. The first insulator line 150a surrounds the light-emitting portion but has an open structure rather than a closed structure such that electric current is injected into the light-emitting portion. That is, there is a gap between both ends of the first insulator line 150a, and electric current is injected into the light-emitting portion through the gap.

The second insulator line 150b is arranged in parallel with a part of the first insulator line 150a. Specifically, the second insulator line 150b extends from the end of the first insulator line 150a and is arranged in parallel with the first insulator line 150a. A length of an electric current injection line is determined according to a length of the second insulator line 150b. Accordingly, resistance of the electric current injection line may be determined.

Referring to FIG. 3, the first insulator line 150a and second insulator line 150b respectively include a convex and concave pattern including a protrusion portion and a recess portion, and the protrusion portion of the first insulator line and the protrusion portion of the second insulator line face each other and form a fuse.

In this case, a gap (W in FIG. 3) between the protrusion portion of the first insulator line and the protrusion portion of the second insulator line is preferably 1.5 μm or less.

Table 1 shows a surface temperature of the first electrode and whether the electric current injection line made of ITO is open, based on a gap between the protrusion portion of the first insulator line and the protrusion portion of the second insulator line when a short circuit of the first and second electrodes occurs. The first electrode is made of ITO.

TABLE 1

|  | W (μm) | Surface temperature of panel (° C.) | ITO open |
|---|---|---|---|
| #1 | 4.5 | 31 | — |
| #2 | 4.0 | 30 | — |
| #3 | 3.5 | 31 | — |
| #4 | 3.0 | 31 | — |
| #5 | 2.5 | 36 | — |
| #6 | 2.0 | 35 | — |
| #7 | 1.5 | 42 | ITO open |
| #8 | 1.0 | 54 | ITO open |

Table 1 shows a narrower gap (W) between the protrusion portion of the first insulator line and the protrusion portion of the second insulator line results in a higher surface temperature of a panel at the time of short circuit. In samples 7 and 8 where a gap between the protrusion portion of the first insulator line and the protrusion portion of the second insulator line is 1.5 μm or less, the electric current injection line made of ITO was open. This indicates that heat of 1000° C. or more was generated when the electric current injection line made of ITO was open.

Table 1 shows that a gap (W) between the protrusion portion of the first insulator line and the protrusion portion of the second insulator line is preferably 1.5 μm or less such that a fuse functions reliably.

In FIG. 3, a length (L) of a fuse structure is not restricted but, for instance, may range from 5 to 20 μm.

As shown in FIG. 1, the electric current injection lines 140 in light-emitting portions 120 are gradually shorter as the distance from the pads 310, 320 (or an edge of the organic lighting apparatus) to the light-emitting portions 120 is greater. In this regard, the length of the first insulator line 150a in each of the light-emitting portions 120 is substantially the same, while the length of the second insulator line 150b is shorter as the distance of the corresponding light emitting portion 120 including the second insulator line 150b from the pads 310, 312 is greater. This allows the resistance in the electric current injection lines 140 farther away from the pads 310, 320 to be lower, thereby compensating for the higher resistance resulting from the longer conductive lines 210 connecting to such light-emitting portions that are farther away from the pads 310, 320.

Referring to FIG. 2, an integrally structured conductive line 210 is arranged in the non-light-emitting area (NLA) while contacting the first electrode 220. The conductive line 210 has a lattice shape (i.e., a first net shape) and, together with an insulation layer 230 also having another lattice shape (i.e., second net shape), defines a plurality of light-emitting portions 120. In this case, a structure where a conductive line 210, a first electrode 220 and an insulation layer 230 are stacked may be included in the non-light-emitting area (NLA). While the embodiment in FIG. 2 has the first electrode 220 stacked on the conductive line 210, in other embodiments the first electrode 220 may be disposed on the substrate 110 and the conductive line 210 may be stacked on the first electrode 220.

The first electrode 220 in the lower part of the organic light-emitting layer 240 may be made of a transparent conductive oxide such that light emits from the lower part of the substrate 110, i.e. the bottom of the substrate. However, a transparent conductive oxide such as ITO has higher resistance than a metallic material. In this case, when the conductive line 210 is further arranged between the substrate 110 and the first electrode 220, as in FIG. 2, electric current may be evenly supplied to the plurality of light-emitting portions. The conductive line 210 may be made of a metallic material having lower resistance than a transparent conductive oxide. The conductive line 210 may be arranged not only in the central area (CA) of the substrate 110 but also in the outer area (OA) of the substrate 110. A gate line that is arranged in the outer area (OA) of the substrate 110 constitutes a part of a pad portion, performs routing to distribute electric current to a gate line arranged in the central area (CA) of the substrate 110 or covers up layers in the upper part of the gate line considering light emitted from the lower part of the substrate.

However, when electric current concentrates on an area near the conductive line 210, evenness of luminance may decrease. Accordingly, the insulation layer 230 is arranged on the upper part of the first electrode 220 in the non-light-emitting area (NLA) so as to cover the conductive line 210. Certainly, the insulation layer 230 may be arranged not only in the upper part of the conductive line 210 but also in a part requiring insulation, e.g., insulation between a second pad and the first electrode. Additionally, the insulation layer 230 may be integrally formed with the insulator lines 150a, 150b. That is, the insulator lines 150a, 150b may be a part of the insulation layer 230.

Figure 5:
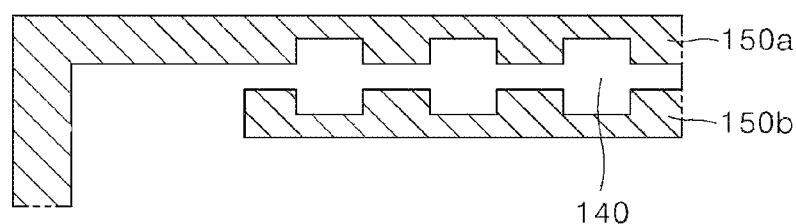
FIG. 5 is a view illustrating other structures of an example electric current injection line including an example fuse structure.
Figure 5:
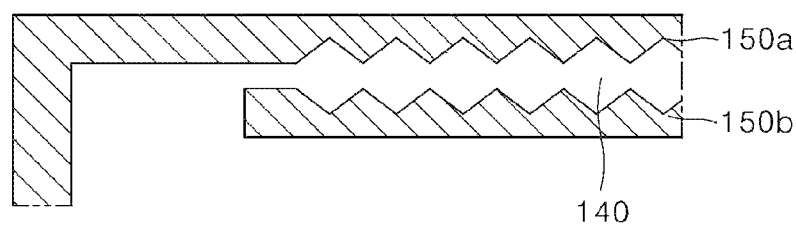

FIG. 5 is a view illustrating other structures of an example electric current injection line including an example fuse structure. As shown in FIG. 5, each of the first insulator line 150a and the second insulator line 150b may have a convex and concave pattern including a protrusion portion and a recess portion with various shapes. For example, the protrusion portion and recess portions may have a rectangular shape as shown in part (a) of FIG. 5. For another example, the protrusion portion and recess portions may have a triangular shape as shown in part (b) of FIG. 5. The shapes of the protrusion portion and the recess portion are not limited to the trapezoidal shape as shown in FIG. 3, the rectangular shape as shown in part (a) of FIG. 5, or the triangular shape as shown in part (b) of FIG. 5, and can be any shape that is not a straight line and has a protruding and a receding geometry such that the distance in the gap between the corresponding protrusion portions on the first insulator line 150a and the second insulator line 150b can be smaller along some, but not all, sections of the first insulator line 150a and the second insulator line 150b. Also, the corresponding protrusion portions and the recess portions of the first insulator line 150a and the second insulator line, respectively, may not necessarily have to be aligned perfectly, as long as there is a gap between the corresponding protrusion portions of the first insulator line 150a and the second insulator line 150b that is smaller than the gaps between remaining portions of the first insulator line 150a and the second insulator line 150b. As explained above, the gap between the protrusion portion of the first insulator line 150a and the protrusion portion of the second insulator line 150b is 1.5 μm or less.

Figure 6A:
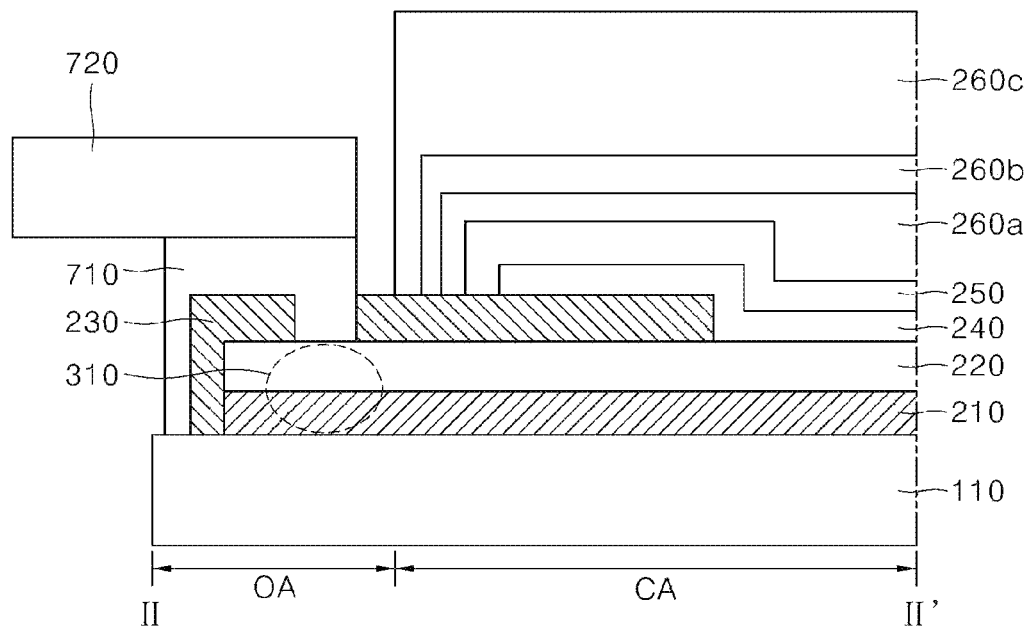
FIG. 6A is a view illustrating a cross section cut along line II-II' in FIG. 1 and an example first pad.
Figure 6B:
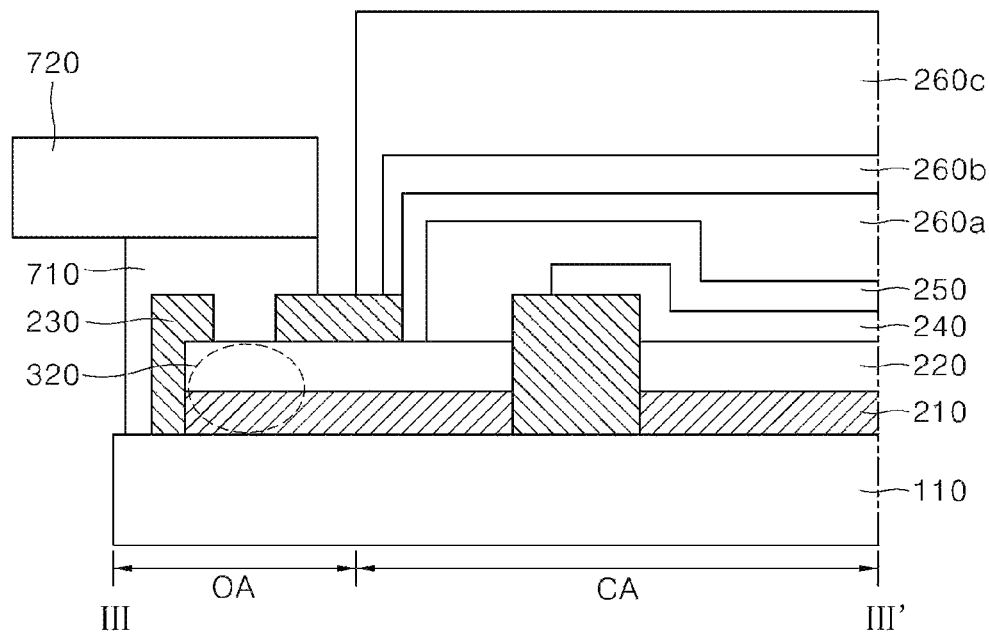
FIG. 6B is a view illustrating a cross section cut along line III-III' in FIG. 1 and an example second pad.

FIG. 6A is a view illustrating a cross section cut along line II-II' in FIG. 1 and an example first pad, and FIG. 6B is a view illustrating a cross section cut along line in FIG. 1 and an example second pad. The first insulator line 150a and the second insulator line 150b in FIG. 2 are omitted from FIG. 6A and FIG. 6B.

Referring to FIGS. 1, 6A and 6B, a pad portion 160a, 160b is arranged on both sides of the outer area (OA) of the substrate 110. Specifically, a first pad portion 160a is arranged on one side of the outer area (OA) of the substrate 110, and a second pad portion 160b is arranged on the other side of the outer area (OA) of the substrate 110. The first pad portion 160a and second pad portion 160b respectively include a first pad 310 connecting with the first electrode 220 and a second pad 320 connecting with the second electrode 250.

FIG. 1 illustrates two pad portions that are arranged on the edge of the substrate. However, one pad portion or four pad portions may be arranged on the edge of the substrate. The number of pad portions is not restricted.

A conductive line 210, a first electrode 220, an insulation layer 230, an organic light-emitting layer 240 and a second electrode 250 are consecutively arranged on the central area (CA) of the substrate 110. Additionally, a conductive line 210, a first electrode 220 and an insulation layer 230 are consecutively arranged on the outer area (OA) of the substrate 110. Referring to FIG. 6A, a part, exposed upward, of the first electrode 220 may be a first pad 310 in the outer area (OA). Referring to FIG. 6B, a part, exposed upward, of the first electrode 220 may be a second pad 320 in the outer area (OA).

That is, the first pad 310 and the second pad 320 may be formed as the same layer as the first electrode 220. However, the second pad 320 is insulated from the first electrode 220 by the insulation layer 230 and connects with the second electrode 250.

The first pad 310 and the second pad 320 may have a multi-layer structure where two or more layers are stacked and, in this case, may include a first layer formed as the same layer as the conductive line 210 and a second layer formed as the same layer as the first electrode 220.

The first pad 310 and the second pad 320 connects with a printed circuit board 720. A conductive film or a conductive adhesive 710 such as an anisotropic conductive film (ACF) may be used to connect the first pad 310 and the second pad 320 with a printed circuit board 720.

Referring to FIGS. 6A and 6B, a plurality of layers 260a, 260b, 260c are further formed on the second electrode 250. At least one of the plurality of layers may be an encapsulation layer. The encapsulation layer may be made of a material for excellently preventing moisture and air from invading such as an inorganic material or a metallic material. FIGS. 6A and 6B illustrate a structure where an organic or inorganic buffer layer 260a, an inorganic layer 260b and a metallic layer 260c are consecutively stacked. However, the structure of the encapsulation layer is not limited to a three-layer structure. Accordingly, the encapsulation layer may have a single-layer, two-layer or four or more-layer structure. When a metallic film is used as the metallic layer 260c, an adhesive layer may be arranged between the inorganic layer 260b and the metallic layer 260c. Additionally, at least one of the plurality of layers may serve as a planarization layer. FIGS. 6A and 6B illustrate an organic or inorganic buffer layer 260a as a planarization layer.

As described above, according to the present disclosure, an organic lighting apparatus includes electric current injection lines that have a fuse structure, in a plurality of light-emitting portions. Even when a short circuit between the first electrode and second electrode in any one of the plurality of light-emitting portions occurs, a fuse may prevent electric current from being injected into the short-circuited light-emitting portion, thereby making it possible to reduce leakage current.

The implementations of the present invention have been described with reference to the drawings. However, it will be apparent that the invention is not limited to the implementations and drawings set forth herein and may be modified and changed by one having ordinary skill in the art within the technical spirit of the invention. Further, even though effects of configurations of the invention are not explicitly described in the description of the implementations, expected advantages based on the configurations should be included in the scope of the invention.

What is claimed is:

1. An organic lighting apparatus comprising:
a substrate;
a plurality of conductive lines arranged on the substrate in a first net shape;
an insulation layer covering the conductive lines and arranged in a second net shape, the insulation layer defining a light-emitting area and a non-light-emitting area on the substrate and the insulation layer formed on the non-light-emitting area;
a first electrode layer, a first part of the first electrode layer disposed in the non-light emitting area between the conductive lines and the insulation layer; and
a plurality of light-emitting portions on the light-emitting area and the non-light-emitting area, at least one of the light-emitting portions comprising:
a first electrode formed as a second part of the first electrode layer in the light-emitting area;
an organic light-emitting layer on the first electrode; and
a second electrode on the organic light-emitting layer,
wherein the first electrode layer is disposed on the light-emitting area and on the plurality of conductive lines in the non-light-emitting area, and has an electric current injection line having resistance higher than the resistance of a remaining part of the first electrode, and the electric current injection line includes a plurality of fuse structures between the light-emitting area and at least one of the plurality of conductive lines,
wherein the electric current injection line comprises a plurality of convex and concave patterns that include a protrusion portion and a recess portion on both a first side and a second side of the current injection line,
wherein each of the fuse structures is formed in a part where the recess portions on both the first side and the second side of the electric current injection line face each other,
wherein a part of the insulation layer is disposed in a same plane as the electric current injection line, and the part of the insulation layer includes a plurality of complementary convex and concave patterns corresponding to and facing the concave and convex patterns, respectively, of the electric current injection line.

2. The organic lighting apparatus of claim 1, wherein a first electric current injection line of a first light-emitting portion among the plurality of light-emitting portions has a first length and a second electric current injection line of a second light emitting portion among the plurality of light-emitting portions has a second length shorter than the first length, the second light emitting portion being farther from an edge of the organic lighting apparatus than the first light emitting portion.

3. The organic lighting apparatus of claim 1, wherein the electric current injection line extends along a first direction, and a width of the electric current injection line along a second direction intersecting the first direction is 1.5 µm or less.

4. The organic lighting apparatus of claim 1, further comprising a first pad electrically connected to the first electrode and a second pad electrically connected to the second electrode, both the first pad and the second pad formed as same layers as the first electrode and the conductive lines.

5. The organic lighting apparatus of claim 1, wherein the conductive lines comprise metallic material, and the first electrode comprises transparent conductive oxide.

6. An organic lighting apparatus comprising:
a substrate;
a plurality of conductive lines arranged on the substrate in a first net shape;
an insulation layer covering the conductive lines and arranged in a second net shape, the insulation layer defining a light-emitting area and a non-light-emitting area on the substrate and the insulation layer formed on the non-light-emitting area;
a first electrode layer, a first part of the first electrode layer disposed in the non-light emitting area between the conductive lines and the insulation layer; and
a plurality of light-emitting portions on the light-emitting area and the non-light-emitting area, at least one of the light-emitting portions comprising:
a first electrode formed as a second part of the first electrode layer in the light-emitting area;
an organic light-emitting layer on the first electrode;
a second electrode on the organic light-emitting layer;
a first insulator line that is arranged along at least one of the conductive lines on a first side of a portion of the first electrode; and
a second insulator line that is arranged along a part of the first insulator line on a second side of the portion of the first electrode,
wherein the first electrode layer is disposed on the light-emitting area and on the plurality of conductive lines in the non-light-emitting area,
wherein each of the first insulator line and the second insulator line comprises a plurality of convex and concave patterns that include a protrusion portion and a recess portion between the light-emitting area and at least one of the plurality of conductive lines, and the protrusion portion of the first insulator line and the protrusion portion of the second insulator line face each other,
wherein the first insulator line and the second insulator line are part of the insulation layer and disposed in a same plane as the at least one of the conductive lines,
wherein the at least one of the conductive lines includes a plurality of complementary convex and concave patterns corresponding to and facing the concave and convex patterns, respectively, of the first insulator line and the second insulator line.

7. The organic lighting apparatus of claim 6, wherein the second insulator line of a first light-emitting portion among the plurality of light-emitting portions has a first length and the second insulator line of a second light emitting portion among the plurality of light-emitting portions has a second length shorter than the first length, the second light emitting portion being farther from an edge of the organic lighting apparatus than the first light emitting portion.

8. The organic lighting apparatus of claim 6, wherein a gap between the protrusion portion of the first insulator line and the protrusion portion of the second insulator line is 1.5 µm or less.

9. The organic lighting apparatus of claim 6, further comprising a first pad electrically connected to the first electrode and a second pad electrically connected to the second electrode, both the first pad and the second pad formed as same layers as the first electrode and the conductive lines.

10. The organic lighting apparatus of claim 6, wherein the conductive lines comprise metallic material, and the first electrode comprises transparent conductive oxide.

11. An organic lighting apparatus comprising:
a substrate;
a plurality of conductive lines arranged on the substrate in a first net shape;
an insulation layer covering the conductive lines and arranged in a second net shape, the insulation layer defining a light-emitting area and a non-light-emitting area on the substrate and the insulation layer formed on the non-light-emitting area;
a first electrode layer, a first part of the first electrode layer disposed in the non-light emitting area between the conductive lines and the insulation layer; and
a plurality of light-emitting portions on the light-emitting area and the non-light-emitting area, at least one of the light-emitting portions comprising:
a first electrode formed as a second part of the first electrode layer in the light-emitting area;
an organic light-emitting layer on the first electrode; and
a second electrode on the organic light-emitting layer;
wherein the first electrode layer is disposed on the light-emitting area and on the plurality of conductive lines in the non-light-emitting area, and has an elongated portion having resistance higher than the resistance of a remaining part of the first electrode outside the elongated portion between the light-emitting area and at least one of the plurality of conductive lines,
wherein the elongated portion of the first electrode includes a pattern of a plurality of protrusions and recesses in a first direction intersecting a second direction in which the elongated portion is extended,
wherein resistance of the elongated portion is higher between the recesses than between the protrusions of the elongated portion, and a fuse structure is formed between the recesses of the elongated portion,
wherein a part of the insulation layer is disposed in a same plane as the elongated portion of the first electrode,
wherein the part of the insulation layer includes a pattern of a plurality of protrusions and recesses corresponding to and facing the recesses and protrusions, respectively, of the elongated portion of the first electrode.

12. The organic lighting apparatus of claim 11, further comprising a first insulator line disposed along a first side of the elongated portion and a second insulator line disposed along a second side of the elongated portion.

13. The organic lighting apparatus of claim 12, wherein the first insulator line is longer than the second insulator line.

14. The organic lighting apparatus of claim 12, wherein a distance between the first insulator line and the second insulator line corresponds to a width of the elongated portion in a first direction intersecting a second direction in which the elongated portion is extended.

15. The organic lighting apparatus of claim 14, wherein the width of the elongated portion is 1.5 μm or less.

16. The organic lighting apparatus of claim 11, further comprising a first pad electrically connected to the first electrode and a second pad electrically connected to the second electrode, both the first pad and the second pad formed as same layers as the first electrode and the conductive lines.

17. The organic lighting apparatus of claim 11, wherein the conductive lines comprise metallic material, and the first electrode comprises transparent conductive oxide.

* * * * *